(12) United States Patent
Tian et al.

(10) Patent No.: US 10,505,341 B2
(45) Date of Patent: Dec. 10, 2019

(54) APPARATUS AND METHODS FOR TUNING AN OPTICAL FILTER

(71) Applicant: Go!Foton Holdings, Inc., Somerset, NJ (US)

(72) Inventors: Feng Tian, Salem, NH (US); Chi Kong Paul Ng, Princeton, NJ (US)

(73) Assignee: Go!Foton Holdings, Inc., Somerset, NJ (US)

( * ) Notice: Subject to any disclaimer, the term of this patent is extended or adjusted under 35 U.S.C. 154(b) by 0 days.

(21) Appl. No.: 15/978,448

(22) Filed: May 14, 2018

(65) Prior Publication Data
US 2018/0337512 A1 Nov. 22, 2018

Related U.S. Application Data

(60) Provisional application No. 62/635,207, filed on Feb. 26, 2018, provisional application No. 62/507,279, (Continued)

(51) Int. Cl.
*G02B 5/20* (2006.01)
*H04B 10/40* (2013.01)
(Continued)

(52) U.S. Cl.
CPC ............ *H01S 5/02415* (2013.01); *G02B 5/20* (2013.01); *G02B 5/28* (2013.01); *G02B 26/001* (2013.01);
(Continued)

(58) Field of Classification Search
CPC combination set(s) only.
See application file for complete search history.

(56) References Cited

U.S. PATENT DOCUMENTS

| 6,525,305 B2 | 2/2003 | Deschamps et al. |
| 2003/0039276 A1* | 2/2003 | Tatsuno ............... H01S 5/0687 372/31 |

(Continued)

OTHER PUBLICATIONS

International Search Report for PCT/US2018/032492, dated Jul. 26, 2018, 3 pages.
(Continued)

*Primary Examiner* — Omar S Ismail
(74) *Attorney, Agent, or Firm* — Lerner, David, Littenberg, Krumholz & Mentlik, LLP (57) ABSTRACT

The present disclosure is directed to an optical device including at least one temperature-dependent tunable element for controlling a wavelength of an optical signal, a first sensor configured to indirectly monitor the optical signal, a second sensor configured to directly monitor the optical signal, and a control circuit. The tunable element may be one of (i) a laser for transmitting an outgoing optical signal and (ii) an optical filter coupled to a photodetector for receiving an incoming optical signal. The control circuit may be configured to receive first and second inputs from the first and second sensors, respectively, adjust the tuned wavelength of the tunable element from a first preselected wavelength to a second preselected wavelength based on the first input received from the first sensor, and maintain the tunable element at the second preselected frequency based on the second input received from the second sensor.

20 Claims, 9 Drawing Sheets

Related U.S. Application Data filed on May 17, 2017, provisional application No. 62/507,283, filed on May 17, 2017.

(51) Int. Cl.

| | |
|---|---|
| *H01S 5/024* | (2006.01) |
| *H01L 25/16* | (2006.01) |
| *G02B 5/28* | (2006.01) |
| *G05D 23/24* | (2006.01) |
| *H04B 10/50* | (2013.01) |
| *H04B 10/572* | (2013.01) |
| *H04B 10/69* | (2013.01) |
| *H04B 10/272* | (2013.01) |
| *H04J 14/02* | (2006.01) |
| *H01S 5/0687* | (2006.01) |
| *G02B 26/00* | (2006.01) |
| *H01S 5/06* | (2006.01) |
| *H01S 5/068* | (2006.01) |

(52) U.S. Cl.
CPC ....... *G05D 23/2451* (2013.01); *H01L 25/167* (2013.01); *H01S 5/0687* (2013.01); *H04B 10/272* (2013.01); *H04B 10/40* (2013.01); *H04B 10/503* (2013.01); *H04B 10/572* (2013.01); *H04B 10/69* (2013.01); *H04J 14/0282* (2013.01); *H01S 5/0612* (2013.01); *H01S 5/06804* (2013.01)

(56) References Cited

U.S. PATENT DOCUMENTS

| | | | |
|---|---|---|---|
| 2003/0044132 A1* | 3/2003 | Nasu | G02B 6/4208 385/92 |
| 2004/0004980 A1 | 1/2004 | Mazed | |
| 2007/0047603 A1* | 3/2007 | Oomori | H04B 10/572 372/34 |
| 2007/0280695 A1* | 12/2007 | Li | H04B 10/506 398/135 |
| 2012/0014398 A1* | 1/2012 | Choi | G02B 6/421 372/20 |
| 2013/0170833 A1* | 7/2013 | Nagarajan | H04J 14/02 14/2 |
| 2014/0119396 A1* | 5/2014 | Dvir | H04B 10/00 372/38.02 |
| 2016/0111856 A1 | 4/2016 | Yan et al. | |
| 2017/0093518 A1 | 3/2017 | Barnard | |

OTHER PUBLICATIONS

International Search Report for PCT/US2018/032494, dated Aug. 1, 2018, 3 pages.

* cited by examiner

APPARATUS AND METHODS FOR TUNING AN OPTICAL FILTER

CROSS-REFERENCE TO RELATED APPLICATIONS

This application claims the benefit of the filing date of U.S. Provisional Patent Application No. 62/507,279 filed May 17, 2017, U.S. Provisional Patent Application No. 62/507,283 filed May 17, 2017, and U.S. Provisional Patent Application No. 62/635,207 filed Feb. 26, 2018, the disclosures of which are hereby incorporated herein by reference

BACKGROUND OF THE INVENTION

In optical transmission systems, cables, such as fiber-optic cables, are used to transmit information. In some systems, the cables extend from an optical line terminal ("OLT") or other optical device to one or more optical network units ("ONUs"). Optical signals of a certain group of wavelengths are transmitted (upstream signal) from the optical device to the ONUs. Additionally, optical signals of a certain group of wavelengths, which may be different from the group of wavelengths of the transmitted optical signals, are transmitted (downstream signal) from the ONUs to the optical device.

In order for the optical device to transmit or receive at a desired wavelength from among the group of wavelengths, the device must be tuned. For a upstream signal, the signal generator (e.g., laser) of the device may be tunable to provide what is effectively a "pre-filtered" signal. Alternatively, the laser may transmit an optical signal to a destination ONU with an optical transmission made up of multiple wavelengths (with minimal or no filtering applied), and the optical signal can be filtered from the transmission at the destination ONU. Similarly, the ONU may transmit a multiple-wavelength optical signal to the optical device, and the signal can be filtered at the optical device. In order to filter such a signal, a tunable optical filter may be provided. To accommodate for transmitting and receiving both "pre-filtered" and non-"pre-filtered" optical signals, the optical device may include either or both of a laser and optical filter that can be tuned to a frequency that corresponds to the desired wavelength. Conventionally, this tuning is performed by changing the temperature of the laser / optical filter. Thus, tuning at the optical device may be performed using a temperature dependent tunable element.

As passive optical networks (PONs) become increasingly faster, it becomes increasingly more important for the tunable element to be tuned at a high speed. At the same time, while it is important to be able to tune the tunable element at a high speed, it is also necessary for the tuning to be precise and accurate in order to minimize attenuation of the desired downstream or upstream signal (e.g., as it passes through the cable or filter). In other words, it is desirable to both rapidly and precisely change a temperature of the tunable element. It is further desirable for the optical device to have a relatively compact size, and to minimize the cost of the temperature control components, as well as the cost of their installation.

Additionally, as the spacing between optical channels in a PON becomes smaller and smaller, and as the bandwidth of each channel becomes increasingly narrowing, it becomes increasingly more important for the tunable element to be locked at a given frequency/bandwidth. Locking the tunable element increases the precision and accuracy, and further minimizes attenuation, of the desired downstream or upstream signal (e.g., as it passes through the cable or filter). In other words, while it is desired to both rapidly and precisely change a temperature of the tunable element, such precision in tunability should not come at the expense of being able to precisely lock the tuned optical signal in place.

BRIEF SUMMARY OF THE INVENTION

The present disclosure is directed to various embodiments of optical devices, optical control systems, and methods that provide for fast, accurate and stable tuning and subsequent locking of an optical signal. This is accomplished by providing at least two tuning feedback mechanisms in the optical device. A first feedback mechanism may be used to provide feedback regarding the temperature of the tunable element of the optical device. This temperature feedback may be used to coarsely tune the optical signal from a previously desired temperature (corresponding to a previously desired optical signal channel) to a new desired temperature (corresponding to a new desired optical signal channel). A second feedback mechanism may be used to provide more direct feedback regarding the optical signal itself, such as the signal's attenuation. This more direct optical signal feedback may be used to finely tune the optical signal at a given desired channel to minimize the attenuation of the signal at the desired channel One aspect of the present disclosure is directed to an optical device including at least one temperature-dependent tunable element for controlling a wavelength of an optical signal, a first sensor configured to indirectly monitor the optical signal (e.g., a temperature sensor configured to monitor a temperature of the tunable element), a second sensor configured to directly monitor the optical signal (e.g., current sensor configured to monitor a magnitude of electrical current from an electrical signal converted from the optical signal), and a control circuit. The tunable element may be one of (i) a laser for transmitting an outgoing optical signal and (ii) an optical filter coupled to a photodetector for receiving an incoming optical signal. The control circuit may be configured to receive a first input from the first sensor, adjust the tuned wavelength of the tunable element from a first preselected wavelength to a second preselected wavelength based on the first input received from the first sensor, receive a second input from the second sensor monitoring the optical signal of the tunable element as adjusted, and maintain the tunable element at the second preselected frequency based on the second input received from the second sensor. For example, the optical device may be an optical transceiver including each of the laser, the photodetector, and the optical filter.

In some examples, the optical device may further include a temperature control device (e.g., thermoelectric cooler) configured to control the temperature of the tunable element. The control circuit may be configured to adjust and maintain the tuned wavelength of the tunable element by instructing the temperature control device to control the temperature of the tunable element.

If the optical device includes the laser, the first sensor may be configured to monitor a temperature of the laser, and the second sensor may be configured to monitor a magnitude of electrical current of an electrical signal converted from the outgoing optical signal transmitted by the laser. The control circuit may be configured to receive an input requesting to adjust a tuned wavelength of the optical device, compare a temperature corresponding to a current tuned wavelength of the optical device with a temperature corresponding to the requested tuned wavelength, if the temperature corresponding to the current tuned wavelength is less than the temperature corresponding to the requested tuned wavelength, control a raising of the temperature of the tunable element to the temperature corresponding to the requested tuned wavelength, and if the temperature corresponding to the current tuned wavelength is greater than the temperature corresponding to the requested tuned wavelength, control a lowering of the temperature of the tunable element to the temperature corresponding to the requested tuned wavelength.

Alternatively or additionally, if the optical device includes the photodetector and the optical filter, the first sensor may be configured to monitor a temperature of the optical filter, and the second sensor may be configured to monitor a magnitude of electrical current of an electrical signal converted from the incoming optical signal received at the photodetector. The control circuit may be configured to receive a first input from the second sensor, access from memory a previous input from the second sensor, compare the magnitude of the electrical signal indicated by the first input with the magnitude of the electrical signal indicated by the second input, if the magnitude of the electrical signal indicated by the second input is lower than the magnitude of the electrical signal indicated by the first input, adjust the tuned wavelength of the tunable element in a first direction, receive a second input from the second sensor indicating a magnitude of the electrical signal at the tuned wavelength as adjusted, compare the magnitude of the electrical signal indicated by the first input to the magnitude of the electrical signal indicated by the second input, and control the tunable element based on the comparison between the first and second inputs from the second sensor, such that the tuned wavelength of the tunable element is maintained at a preselected wavelength.

Another aspect of the present disclosure is directed to a control circuit included in a device having at least one of an optical transmitter or an optical receiver, and having a temperature-dependent tunable element coupled to the optical transmitter or optical receiver. The control circuit may be coupled to the tunable element and may be configured to receive an input from a first sensor (e.g., temperature sensor) configured to indirectly monitor an optical signal of the tunable element, tune the optical filter from a first wavelength to a second tuned wavelength based on the input received from the first sensor, receive an input from a second sensor (e.g., current sensor) configured to directly monitor the optical signal of the tunable element at the second tuned wavelength, and maintain the tunable element at the second tuned wavelength based on the input received from the second sensor. The tunable element may be one of a laser configured to transmit optical signals or an optical filter configured to filter optical signals received by a photodetector coupled to an output of the optical filter.

The control circuit may be configured to tune the tunable element from the first tuned wavelength to the second tuned wavelength based on the monitored temperature of the tunable element. In some examples, the control circuit may be coupled to a thermoelectric cooler, and may be configured to instruct the thermoelectric cooler to control a temperature of the tunable element in order to tune the tunable element from the first tuned wavelength to the second tuned wavelength, to maintain the optical filter at the second tuned wavelength, or both. The control circuit may be further configured to receive an input requesting to adjust a tuned wavelength of the optical device to the second tuned wavelength, compare a temperature corresponding to the first tuned wavelength of the optical device with a temperature corresponding to the second tuned wavelength of the optical device, if the temperature corresponding to the first tuned wavelength is less than the temperature corresponding to the second tuned wavelength, control a raising of the temperature of the tunable element to the temperature corresponding to the second tuned wavelength, and if the temperature corresponding to the first tuned wavelength is greater than the temperature corresponding to the second tuned wavelength, control a lowering of the temperature of the tunable element to the temperature corresponding to the second tuned wavelength.

The control circuit may be further configured to receive a first input from the second sensor, access from memory a previous input from the second sensor, compare the magnitude of the electrical signal indicated by the first input with the magnitude of the electrical signal indicated by the second input, if the magnitude of the electrical signal indicated by the second input is lower than the magnitude of the electrical signal indicated by the first input, adjust a tuned wavelength of the optical filter in a first direction, receive a second input from the second sensor indicating a magnitude of the electrical signal at the tuned wavelength as adjusted, compare the magnitude of the electrical signal indicated by the first input to the magnitude of the electrical signal indicated by the second input, and control the optical filter based on the comparison between the first and second inputs from the second sensor, such that the tuned wavelength of the optical filter is maintained at the second tuned wavelength.

Yet another aspect of the present disclosure is directed to a method of tuning an optical device comprising a control circuit at least one temperature-dependent tunable element for controlling a wavelength of an optical signal transmitted or received by the optical device. The tunable element may be one of (i) a laser for transmitting an outgoing optical signal and (ii) an optical filter coupled to a photodetector for receiving an incoming optical signal. The method may be executed by the control circuit and may involve: receiving an input from a first sensor configured to indirectly monitor an optical signal of the tunable element; tuning the optical filter from a first wavelength to a second tuned wavelength based on the input received from the first sensor; receiving an input from a second sensor configured to directly monitor the optical signal of the tunable element at the second tuned wavelength; and maintaining the tunable element at the second tuned wavelength based on the input received from the second sensor.

DETAILED DESCRIPTION

Figure 1:
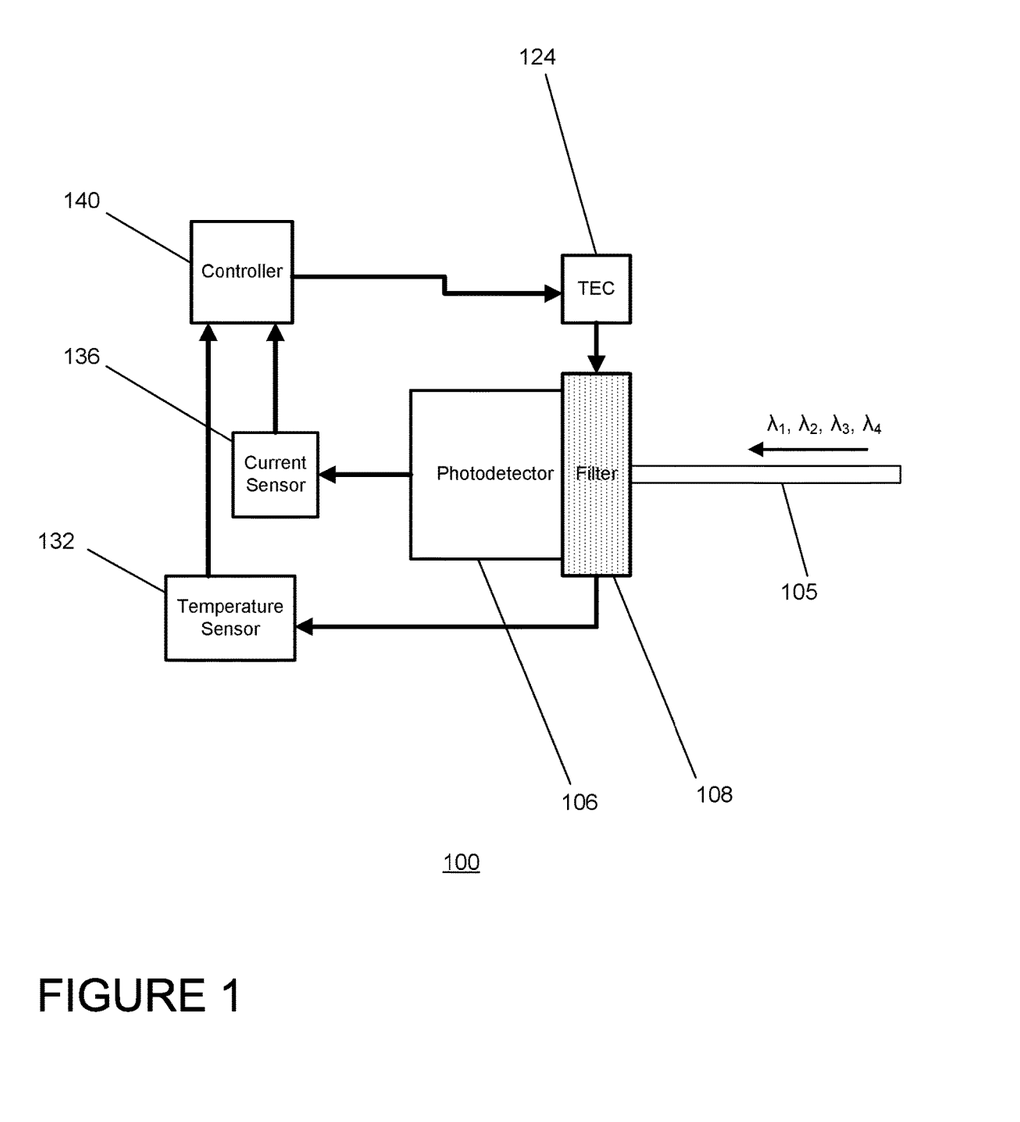
FIG. 1 is a block diagram of an optical device in accordance with an aspect of the present disclosure.

FIG. 1 shows a block diagram of an optical device 100 for receiving an optical signal at an optical signal receiver 106, such as a photodetector, from one or more optical network units over a cable 105, such as an optical fiber. The optical fiber may be, but is not limited to being made of glass fibers.

The optical signal is filtered by a tunable optical filter 108. The optical filter 108 may be a partially transmitting and partially reflecting optical filter, commonly known as a TAP filter. The optical filter may be, but is not limited to being, made of any one of glass, plastics such as polycarbonates or acrylics, or a multilayered thin film coating made of dielectric materials, such as $SiO_2$ and $TiO_2$. The optical filter 108 may be temperature-dependent, meaning that the temperature of the filter affects its operation. For example, if the filter is a bandpass filter, then the central wavelength passed by the filter may shift as the temperature of the filter changes. The correlation between filter temperature and central wavelength may be predefined based on the properties of the filter. The filtered optical signal may be converted by the photodetector 106 to an electronic signal.

The optical device 100 yet further includes a temperature control device 124. The temperature control device may be, but is not limited to being, a thermoelectric cooler (TEC) or thin film heater. The temperature control device 124 may be externally installed or embedded in the optical device 100. In some cases, the temperature control device 124 may be co-fabricated with the optical device 100, generally when the temperature control device 124 is implemented for heating purposes only (e.g., a separate temperature control device cools the rest of the device to a low temperature, thereby creating a local heat sinking region at a relatively low temperature and resulting in relatively fast cooling of the tunable element when the temperature control device is off due to a large temperature gradient). The temperature control device 124 may be is positioned to provide temperature control within a localized region of the optical device 100 including the optical filter 108, such that controlling the temperature of the localized region effectively controls the temperature of the optical filter 108. In some instances, the localized region may include a space within a given radius of the temperature control device 124. Thus, placing the second temperature control device 124 in close proximity (e.g., within said radius) to the optical filter 108 ensures that the temperature control device 124 may rapidly and accurately control the temperature of the filter 108 without having to change the temperature of the entire device 100. If the temperature control device 124 is a TEC, then the localized region may further be defined by an orientation of the TEC, such that the localized region extends in a direction in which the TEC faces.

Additionally or alternatively, the localized region may be defined by a casing or housing that fully or partially encloses the temperature control device 124 and the optical filter 108. Such a casing may be useful for concentrating the cooling effect yielded by the temperature control device 124 around the optical filter 108, thereby ensuring that the temperature control device 124 may rapidly and accurately control the temperature of the filter 108.

In the specific example of FIG. 1, the optical filter 108 is integrated with the photodetector 106 in a common housing, and a TEC 124 is positioned on or in close proximity to the common housing of the photodetector 106 and optical filter 108. In this manner, the TEC 124 may responsible only for controlling the temperature of the photodetector (and the integrated filter), and not for controlling the overall temperature of the optical device 100.

The optical device also includes a plurality of sensors for sensing properties of the received optical signal. The plurality of sensors may include a temperature sensor 132 and a current sensor 136. The temperature sensor 132 may be adapted to receive and determine a wavelength of the optical signal filtered by the optical filter 108. The temperature sensor 132 may be, but is not limited to being, a resistive temperature sensor such as Negative Temperature Coefficient (NTC) thermistor or Positive Temperature Coefficient (PTC) thermistor. The current sensor 136 or ammeter may be adapted to receive and determine a magnitude of the electronic signal outputted by the photodetector 106. In other instances, the optical device may further include a wavelength sensor, which may be, but is not limited to being, one of a wavelength meter or spectrum analyzer.

The optical device 100 further includes a controller 140 or control circuit for controlling operations as described in the present application. The controller 140 may be adapted to receive the measurements collected from the plurality of sensors, and further configured to process the received measurements. The controller 140 may be further configured to provide instructions to the temperature control device based on the processed measurements. In this way, the filtered optical signal is utilized as a feedback, directly, indirectly, or both, to control operation of the optical filter 108. Such control may include changing the filter from a first setting to a second setting (e.g., from one optical signal channel to another optical signal channel), or maintaining the filter at a given setting (e.g., locking the device into a given optical signal channel).

The example of FIG. 1 shows a single control block 140, but it will be understood that the controller 140 may include multiple control devices in order to carry out the processes described in the present disclosure. The controller 140 may be integrated with the optical device 100, may be a stand-alone device communicatively coupled to the optical device 100, or any combination thereof. An example controller is described in greater detail below in connection with FIG. 4.

Because the temperature control device 124 is needed only for regulating the temperature of the filter 108, the operational temperature range of the temperature control device 124 may be narrowly selected to correspond to the operational range of the filter 108. As noted above, the filter 108 may be temperature dependent, meaning that the center wavelength passed by the filter 108 may shift based on the filter's temperature (e.g., 0.1 nm/° C.). In this manner, any given temperature of the filter 108 may have a one-to-one correspondence with a given wavelength. Thus, for an optical device configured to receive optical signals across a predetermined range of wavelengths, the operational range of the filter may correspond to the same predetermined range of wavelengths, and the operational range of the temperature control device may be limited to the range of temperatures that correspond to the same predetermined range of wavelengths.

For example, for an optical filter that shifts 0.1 nm/° C. included in an optical device that receives optical signals at any one of four channels with spacing of about 0.8 nm between channels, the operational range of the temperature control device may be about 24° C. If the channels are spaced closer, then the operational range of the temperature control device may be less (e.g., 12° C. for 0.4 nm spacing between channels).

Figure 2:
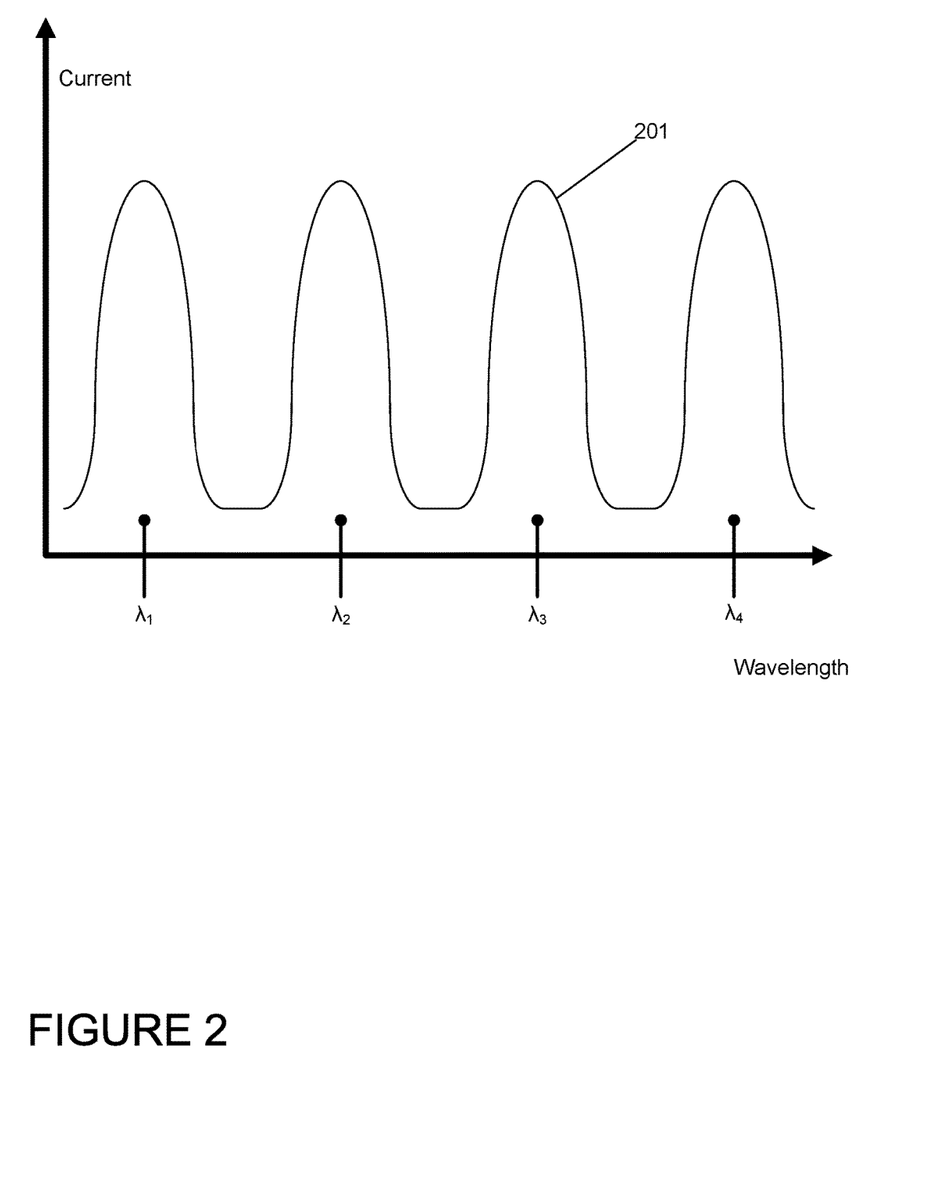
FIG. 2 is a plot illustrating electrical current plotted against wavelength of an optical signal in accordance with an aspect of the present disclosure.

Altogether, the operational temperature range of the temperature control device may be configured to cover the range of wavelengths received by the optical device, in order to allow the optical signals at each of those wavelengths to be received without attenuation. By way of example, FIG. 2 illustrates four predetermined wavelengths $\lambda_1$, $\lambda_2$, $\lambda_3$ and $\lambda_4$ or channels at which the optical device photodetector is configured to receive an optical signal. These wavelengths may similarly be plotted against corresponding temperatures, since there is a one-to-one relationship between a given temperature and the wavelength passed by the filter at that temperature. The temperature control device is configured to selectively adjust the temperature of the filter to any one of the temperatures corresponding to the predetermined wavelengths $\lambda_1$, $\lambda_2$, $\lambda_3$ and $\lambda_4$.

In the example of FIG. 2, the predetermined wavelengths are equally spaced. However, in examples involving other optical devices, the predetermined wavelengths may be spaced unevenly, provided that the wavelengths are spaced apart by at least a threshold minimum.

Also shown in FIG. 2 is a plot of the electrical current generated by the photodetector 106. Curve 201 represents the amount of electrical current generated by the photodetector at a given tuned wavelength of the photodetector. When the filter is tuned to any one of channels $\lambda_1$, $\lambda_2$, $\lambda_3$ and $\lambda_4$, the optical signal at the tuned wavelength is passed through the filter and is converted to a relatively high electrical signal. By contrast, when the filter is tuned to a point between the channels, no electrical current is generated at the photodetector since there is no optical signal between the channels.

In the example of FIG. 2, curve 201 is the result of the optical filter being a bandpass filter. Unlike a notch or band-stop filter, wavelengths and frequencies outside of the bandpass filter's bandwidth are gradually attenuated, instead of abruptly cut off. Therefore, the range of tuned wavelengths of the filter may be divided into three categories:

(1) The filter is centered at channels $\lambda_1$, $\lambda_2$, $\lambda_3$ and $\lambda_4$. The optical signal at the centered channel is fully passed through the filter.

(2) The filter is centered somewhere between channels $\lambda_1$, $\lambda_2$, $\lambda_3$ and $\lambda_4$. The signals are fully cut off.

(3) The filter is centered close to but not at one of channels $\lambda_1$, $\lambda_2$, $\lambda_3$ and $\lambda_4$. The optical signal close to the centered channel is partially but not fully passed through the filter. The amount of the signal that passes through depends of how close the filter is centered to the channel's wavelength.

Figure 3:
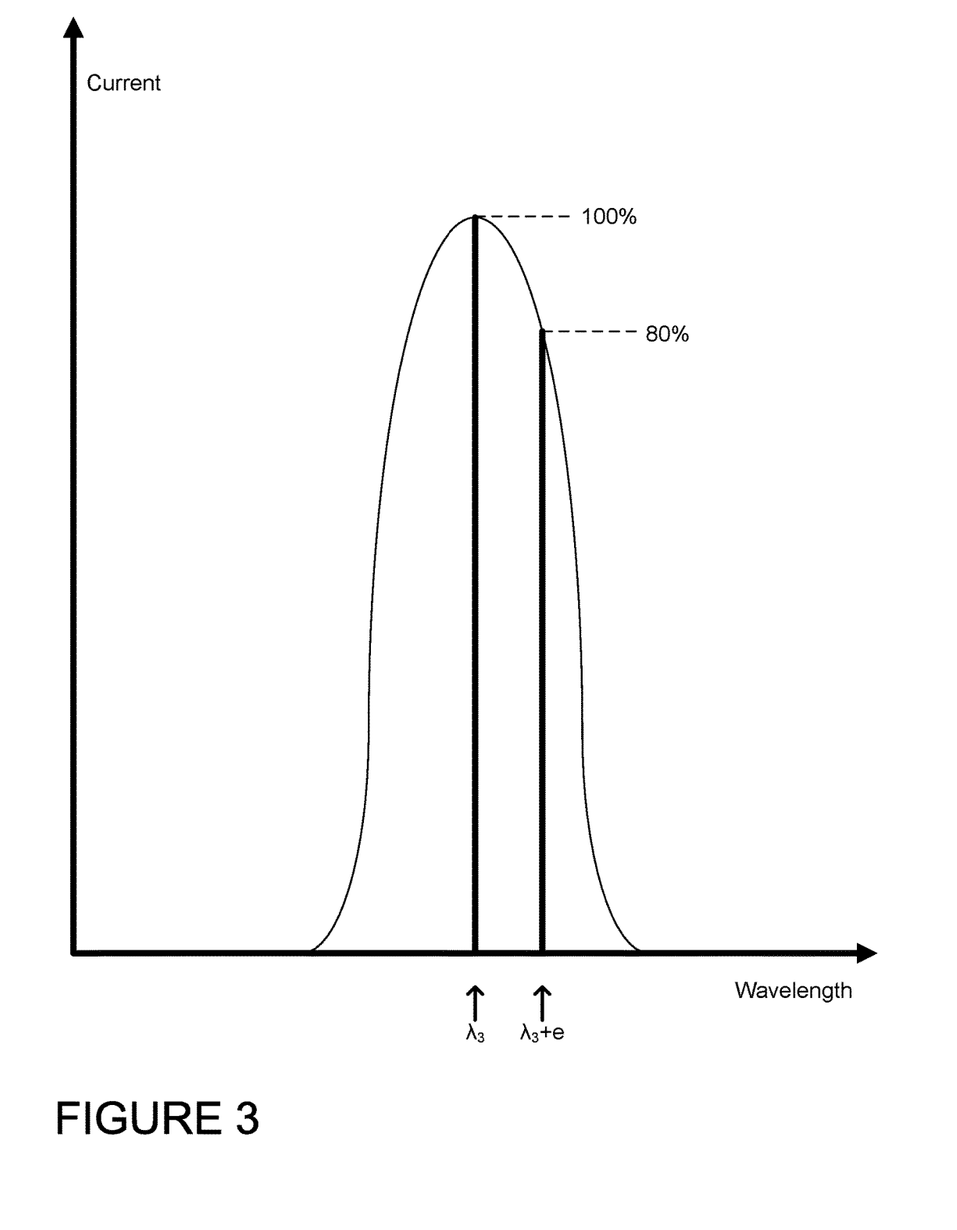
FIG. 3 is a zoomed and annotated portion of the plot of FIG. 2.

The amount of a signal that passes through the wavelength may directly correspond to the magnitude of the electrical signal generated by the photodetector (also referred to as photodetector current). As illustrated in FIG. 3, when the filter is tuned to wavelength $\lambda_3$, 100% of the optical signal at wavelength ag is fully passed through, resulting in the photodetector generating an electrical signal of a maximum magnitude. By contrast, when the filter is tuned to wavelength $\lambda_3$+e, only about 80% of the optical signal at $\lambda_3$ is passed through, resulting in the photodetector generating an electrical signal of a reduced magnitude (e.g., 80% of the maximum magnitude).

The direct correspondence between wavelength and photodetector current may be used to track the filter's tuned wavelength. Taking the example of FIG. 3 for instance, a current sensor may be used to measure and detect fluctuations in the photodetector current. Since it is known that the downstream optical signal is received at one of plurality of predetermined wavelengths, if the optical filter is centered close to but not at one of those predetermined wavelengths, the deviations in the center wavelength of the filter may result in attenuation of the received optical signal, causing the photodetector current to drop. The current sensor may then sense this drop in current, and provide the sensed measurement to the controller, which may determine from the drop in current that there is a small fluctuation in the temperature of the optical filter. In response to the drop in current, the controller may instruct the temperature control device to adjust the temperature of the optical filter in order for the tuned wavelength of the optical filter to be maintained at the temperature corresponding to the predetermined channel wavelength.

Figure 4:
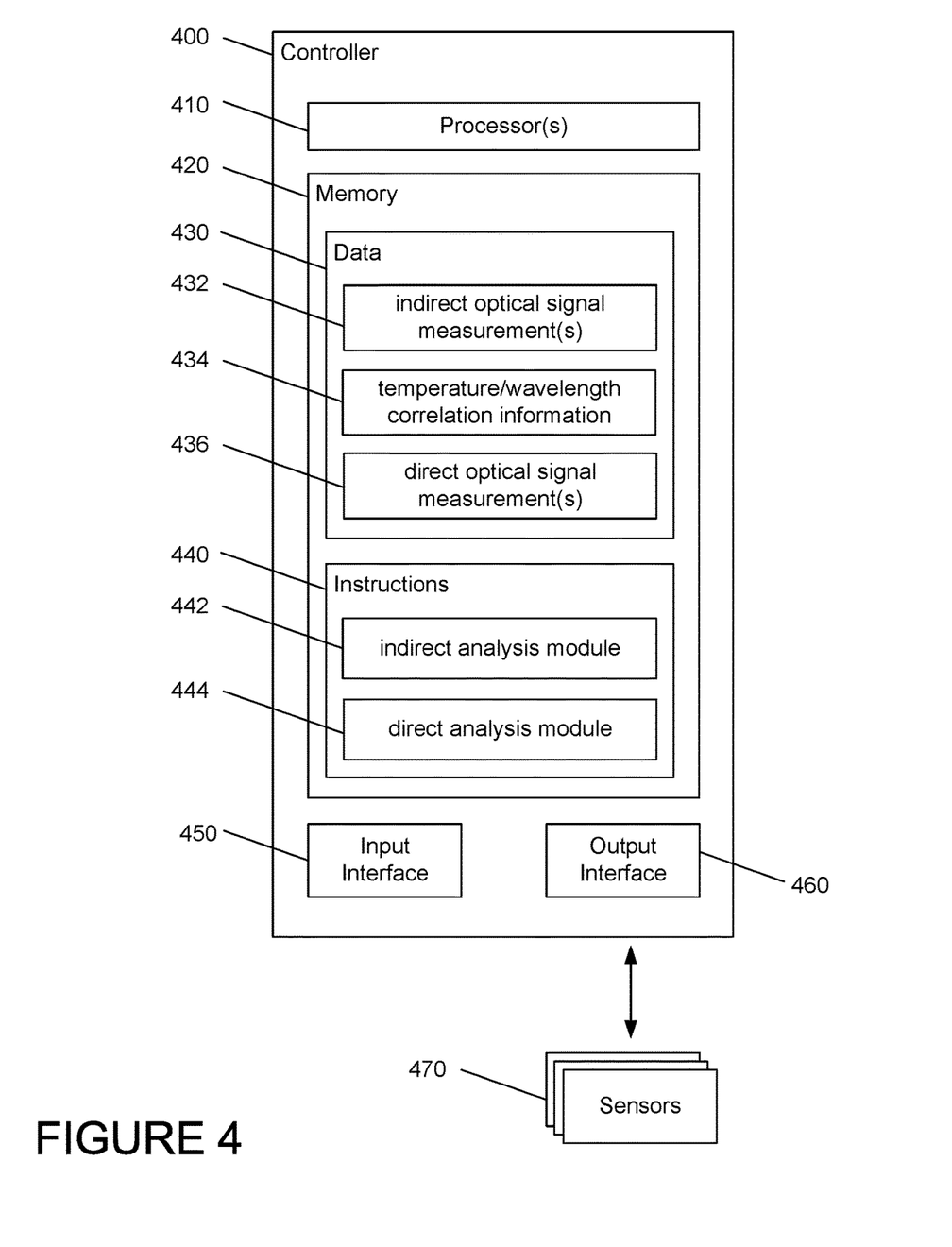
FIG. 4 is a block diagram of a controller of an optical device in accordance with an aspect of the present disclosure.

FIG. 4 is a block diagram of an example controller 400. The controllers may include one or more processors 410 (e.g., central processing units, application-specific integrated circuits, field programmable gate arrays, etc.), memory 420 (e.g., hard-drive, ROM, RAM, CD-ROM, write-capable, read-only, etc.) storing both data 430 and instructions 440, an input interface 450 for receiving data, and an output interface 460 for transmitting instructions and optionally data.

While one processor block is shown, the controller 400 may also include multiple processors which may or may not operate in parallel. The processor 410 may carry out programmed instructions stored in the memory 420.

The stored data 430 may include measurements of the optical signal(s) received at the optical device from the one or more ONUs. Some of the optical signal measurements may be indirect measurements 432. For instance, a measurement of the temperature of the optical filter may indicate the wavelength of an optical signal passed through the filter, since there is a one-to-one correlation between the filter's temperature and its tuned wavelength. This temperature/wavelength correlation information 434 may also be stored in the controller Some of the optical signal measurements may be direct measurements 436. For instance, a measurement of the electrical current output by the photodetector may indicate how closely tuned the optical filter is to the wavelength of the optical signal being received by the photodetector.

Using the one or more processors 410, the controller 400 may include an indirect analysis module 442 for analyzing the indirect sensor information (e.g., temperature data) received via the input interface 450, determining a desired temperature for the temperature control device based on the analysis, and outputting an instruction to set the temperature control device to the desired temperature via the output interface 460. Additionally, the controller 400 may include a direct analysis module 444 for analyzing the direct sensor information (e.g., electrical current data) received via the input interface 450, determining a desired temperature for the temperature control device based on the analysis, and outputting an instruction to set the temperature control device to the desired temperature via the output interface 460.

Sensors 470 may include temperature sensors and current sensors as shown in FIG. 1, as well as other sensors capable of directly or indirectly monitoring the optical signal.

Figure 5:
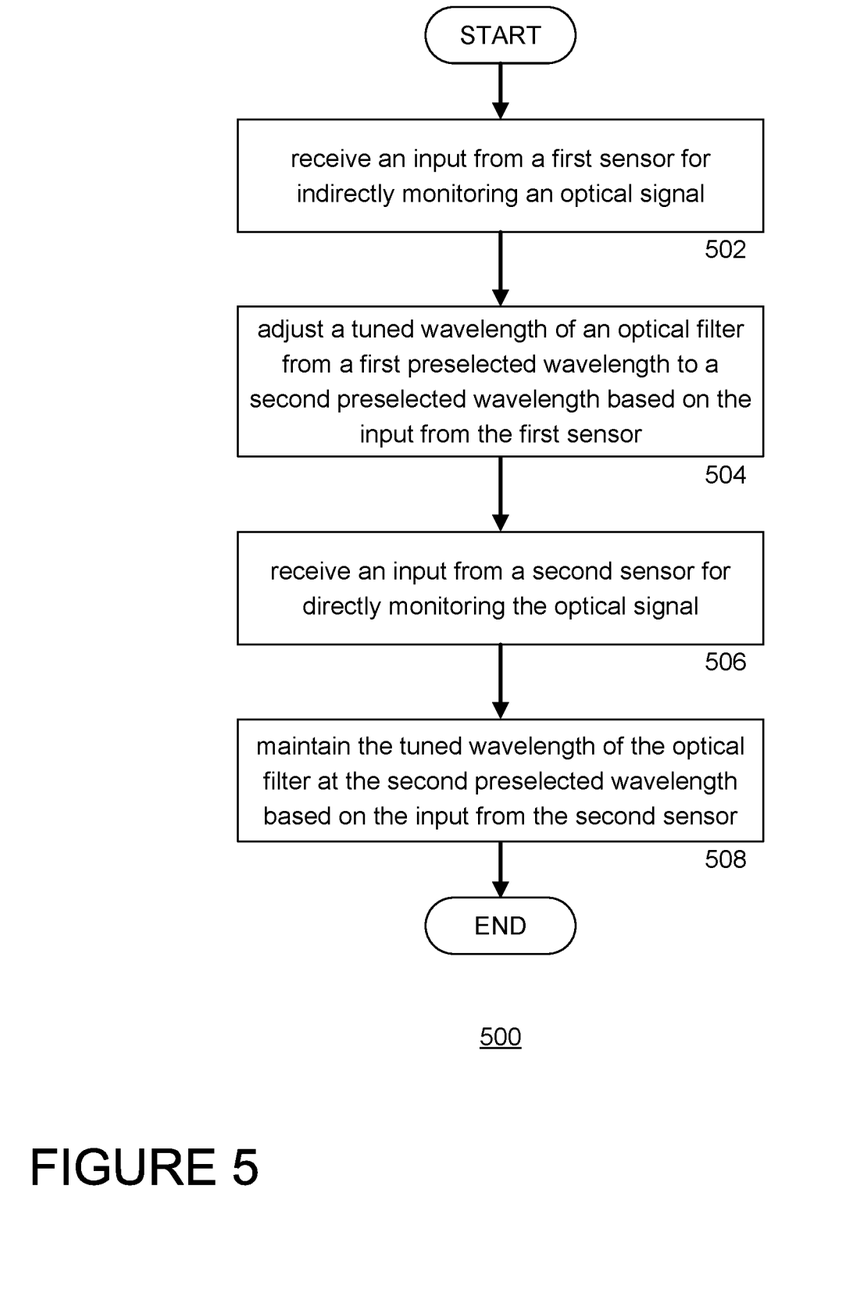
FIGS. 5-7 are flow diagrams of one or more methods in accordance with aspects of the present disclosure.

FIG. 5 is a flow diagram illustrating an example routine 500 by which a controller may perform the above described operations. It should be understood that the operations of the example routine 500 do not have to be performed in the precise order described below. Rather, various operations can be handled in a different order, or simultaneously. Moreover, operations may be added or omitted.

At 502, the controller receives an input from a first sensor for indirectly monitoring an optical signal. As noted above, the first sensor may be a temperature sensor, and the optical signal may be indirectly monitored using measurements of a temperature of the optical filter.

At 504, the controller adjusts a tuned wavelength of an optical filter from a first preselected wavelength to a second preselected wavelength based on the input from the first sensor. Stated another way, if the optical device receives optical signals at more than one wavelength channel, the controller can tune the optical device to a new channel by controlling the tuned wavelength of the optical filter. This may be done by sending an instruction to a temperature control device, as explained above.

At 506, the controller receives an input from a second sensor for directly monitoring the optical signal. As noted above, the second sensor may be a current sensor, and the optical signal may be directly monitored using measurements of the electrical current outputted by the photodetector connected to the optical filter.

At 508, the controller maintains the tuned wavelength of the optical filter at the second preselected wavelength based on the input from the second sensor. Stated another way, for a given wavelength channel to which the optical device is tuned, the controller can keep the optical device tuned to that channel. This can be done by monitoring the electrical current outputted by the photodetector, and then sending an instruction to a temperature control device to correct deviations in the monitored electrical current.

Figure 6:
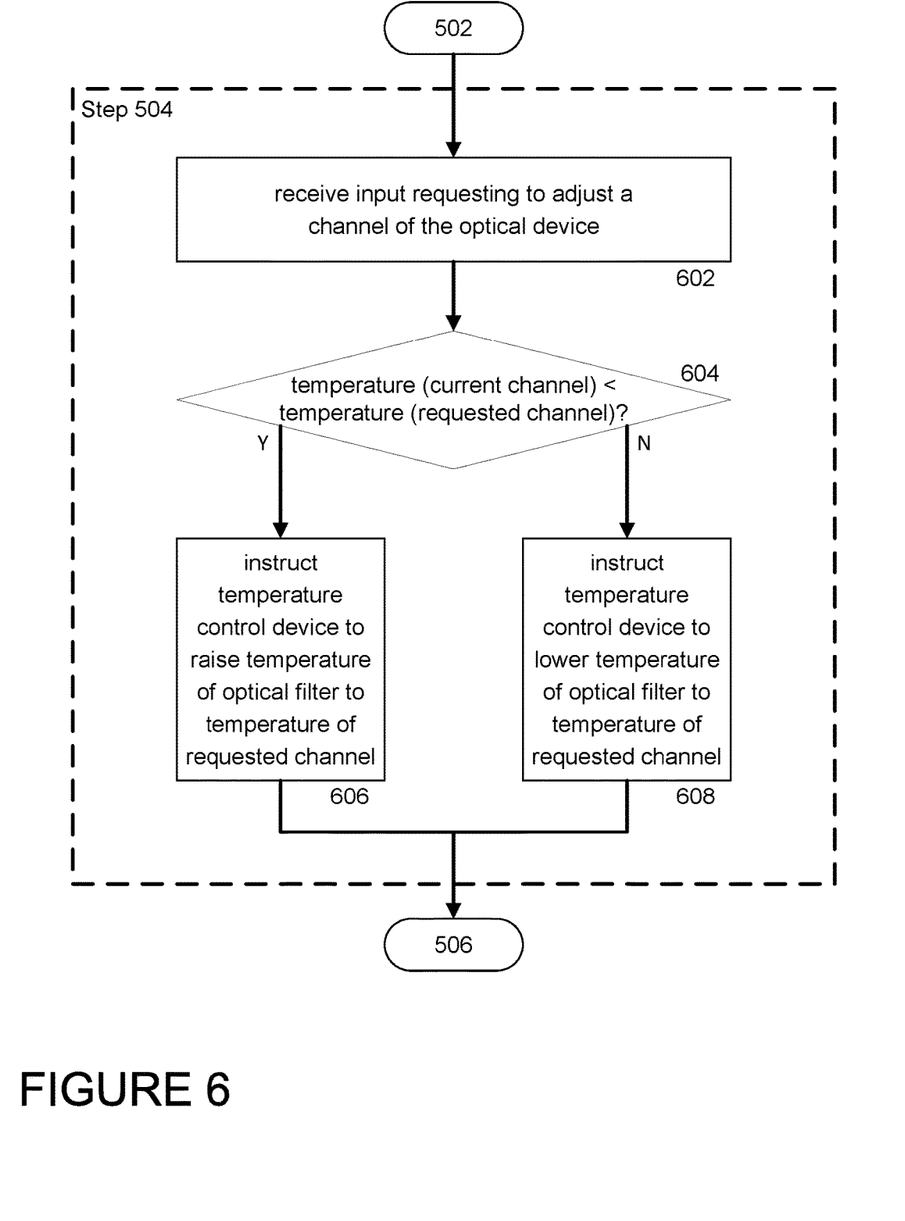

FIG. 6 is a flow diagram illustrating an example routine 600 by which the controller can adjust a tuned wavelength of an optical filter. At 602, the controller receives an input requesting to adjust a channel of the optical device, such as from a currently tuned optical signal channel wavelength to a different wavelength. The wavelengths may correspond to predetermined optical signal channels of the optical device. At 604, the controller compares the temperature corresponding to the current channel to the temperature corresponding to the requested channel. If the current channel's corresponding temperature is less than that of the requested channel, then at 606 the controller instructs the temperature control device to raise the temperature of optical filter to the temperature corresponding to the requested channel. If the current channel's corresponding temperature is greater than that of the requested channel, then at 608 the controller instructs the temperature control device to lower the temperature of optical filter to the temperature corresponding to the requested channel. Operations may then resume with step 506 of FIG. 5.

Figure 7:
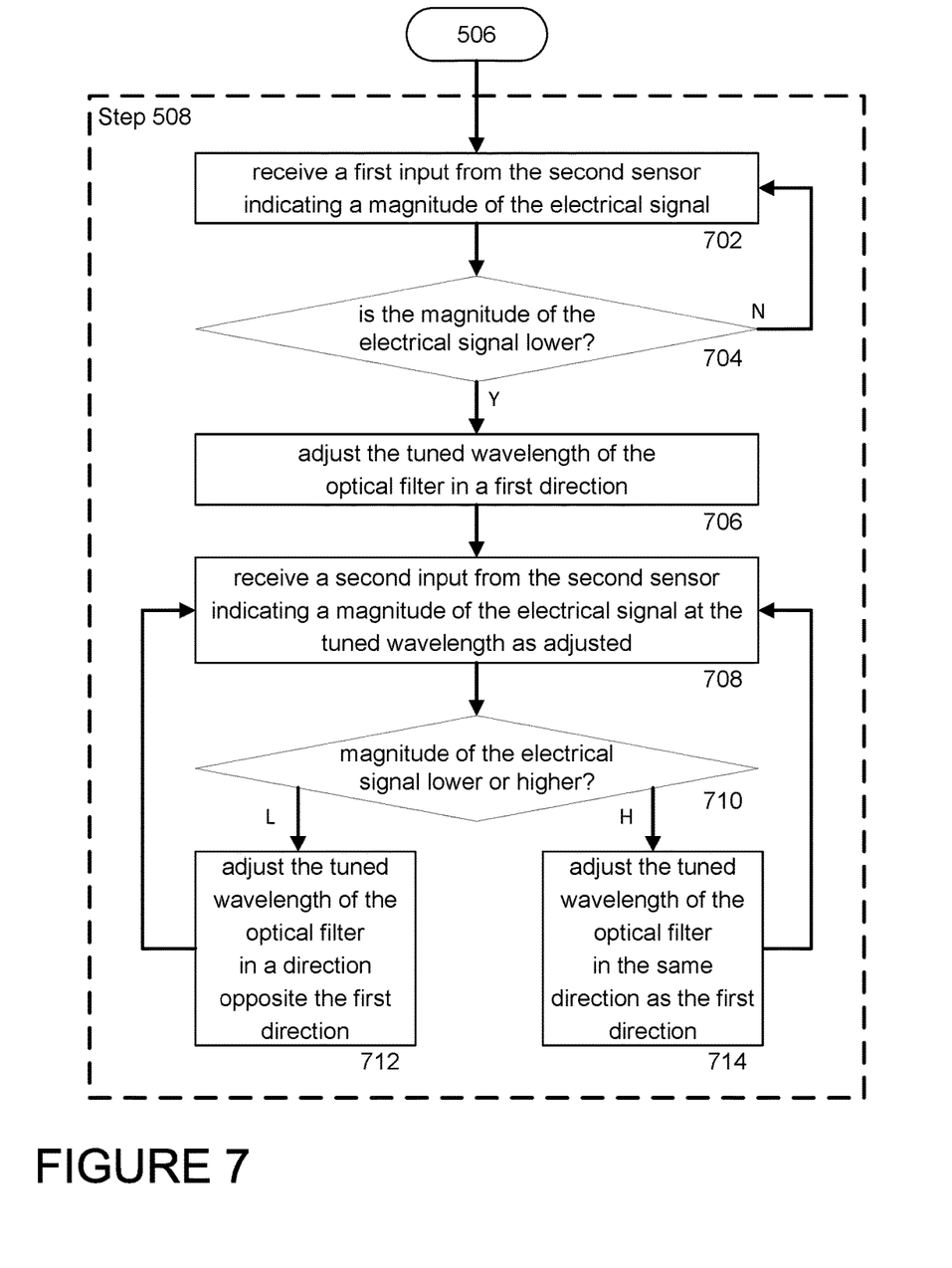

FIG. 7 is a flow diagram illustrating an example routine 700 by which the controller can maintain the tuned wavelength of an optical filter at a given selected wavelength. In the example of FIG. 7, the received second sensor input of FIG. 5 is a current measurement of an electrical signal outputted by a photodetector. At 702, the controller receives a first input from the second sensor indicating a magnitude of the electrical signal. At 704, the controller compares the magnitude of the electrical signal to a previous magnitude of the electrical signal. The previous magnitude may be stored in the controller's memory and accessed for this comparison. If the controller determines that the current magnitude is not less than the previous magnitude (e.g., the difference exceeding a predetermined threshold value, the difference exceeding a predetermined threshold percentage, etc.), then operations may resume at 702 and repeat. If the controller determines that the current magnitude is less than the previous magnitude, then at 706, the controller instructs the temperature control device to adjust the tuned wavelength of the optical filter in a first direction, either making the filter warmer or colder. The first input, like the previous input, may be stored in the controller memory. Then at 708, the controller receives a second input from the second sensor indicating a magnitude of the electrical signal at the tuned wavelength as adjusted. At 710, the controller compares the second input to the first input (which may be accessed from memory) to determine whether the magnitude of the electrical signal has lowered or raised due to the adjustment at step 706. If the magnitude of the electrical signal is lower (L), meaning that the adjustment at step 706 was in the wrong direction, then at 712 the controller instructs the temperature control device to adjust the tuned wavelength of the optical filter in a direction opposite the first direction. If the magnitude of the electrical is higher (H), meaning that the adjustment at step 706 was in the correct direction, then at 714 the controller instructs the temperature control device to adjust the tuned wavelength of the optical filter in the same direction as the first direction. Operations may resume at 708, and the temperature correction may repeat until a maximum electrical current signal is reached (e.g., the electrical signal remains the same, the controller keeps alternating between operations 712 and 714, etc.)

The above examples relate to tuning and locking of an optical signal channel received by an optical device, in which the optical signal is filtered through a temperature-dependent filter. However, the same technology may be applicable to other temperature-dependent components of an optical device. For example, the optical signal generated and transmitted by the optical device, for instance using a laser, may be controlled by adjusting a temperature of the laser. While precision locking of the laser using indirect measurements may be performed for lasers generating optical signals at relatively high spacing, such as with optical signal channels using wavelength division multiplexing (WDM), coarse WDM (CWDM) or even dense WDM (DWDM), for technologies using closer signal channel spacings, such as ultra-dense WDM, greater precision for optical signal generation locking may become necessary. In such instances, it may be possible to monitor the generated optical signal using a photodetector, and to regulate the laser using the same principles as described above.

Figure 8:
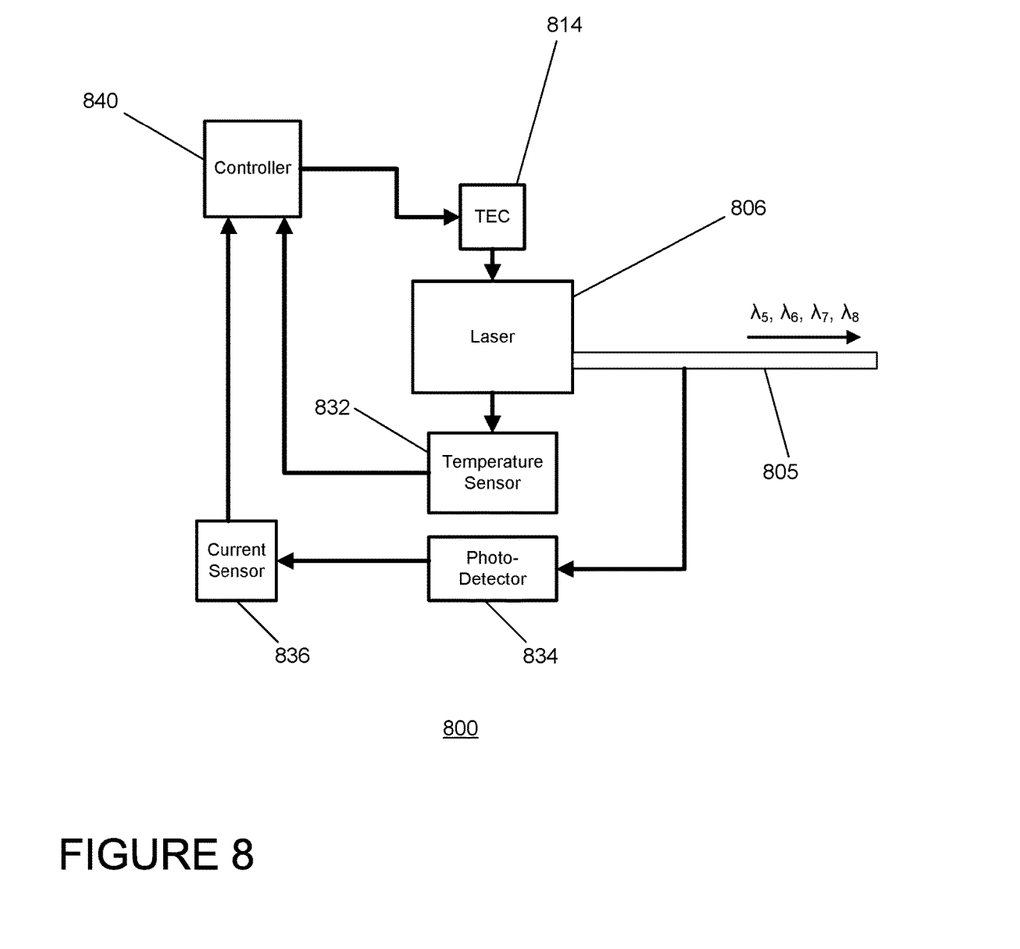
FIG. 8 is a block diagram of another optical device in accordance with an aspect of the present disclosure.

For example, FIG. 8 is a block diagram of another optical device 800 for generating and transmitting an optical signal (at any one of wavelengths $\lambda_5$, $\lambda_6$, $\lambda_7$ and $\lambda_8$) from an optical signal generator 806 or transmitter, such as a laser, to one to or more optical network units over a cable 805, such as an optical fiber. As in FIG. 1, the optical fiber of FIG. 8 may be, but is not limited to being, made of glass fibers.

The optical signal generator 806 may be temperature-dependent, meaning that its temperature affects its operation. For example, in the case of a laser, the temperature of the laser affects the wavelength of light outputted by the laser. The correlation between laser temperature and wavelength may be predefined based on the properties of the laser.

Similar to the device of FIG. 1, the device 800 of FIG. 8 includes sensors for both direct and indirect measurement of the optical signal transmitted by the laser 806. A temperature sensor 832 measures a temperature of the laser, and provides this measurement to controller 840. A photodetector 834 converts the optical signal to an electrical signal. A current sensor 836 senses the magnitude of the electrical signal, and provides this measurement to the controller 840. The controller then instructs a temperature control device 814 to control a temperature of the laser 806 based on an analysis of the received measurements, for instance using the methods described above in FIGS. 5-7 (except that the temperature control device is used to tune the wavelength of a laser instead of an optical filter).

Figure 9:
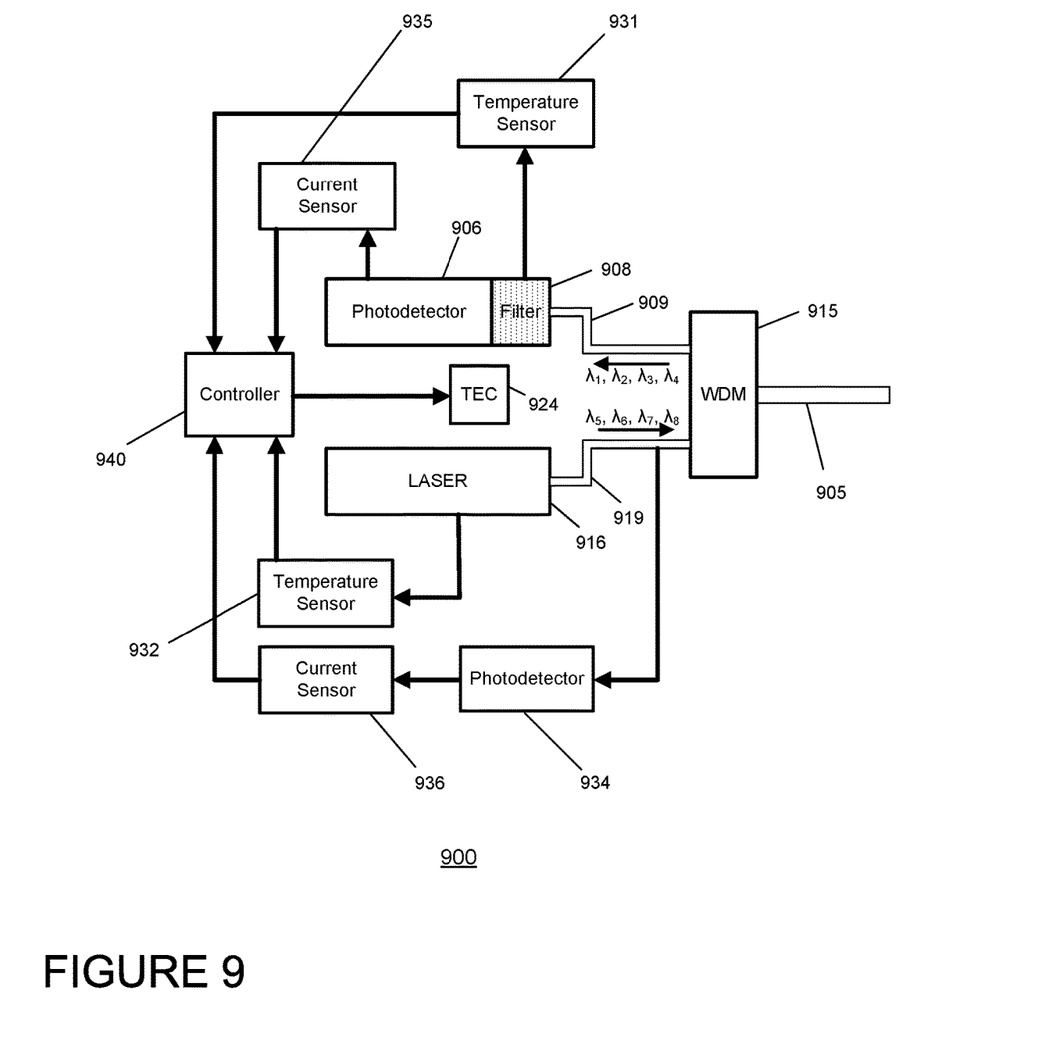
FIG. 9 is a block diagram of yet another optical device in accordance with an aspect of the present disclosure.

The above example devices, methods, and control systems illustrate signal changing and locking in an optical device that either sends or receives optical signals. However, it should be recognized that the same principles may be applied to an optical transceiver that performs both transmitting and receiving optical signals. FIG. 9 is a block diagram of an optical transceiver device 900 including a photodetector 906, a laser 916 and a WDM 915 for controlling the transmission of optical signals to and from the photodetector and laser. The optical signals may be transmitted over cable 905 bi-directionally between the device 900 and one or more ONUs. The WDM may be any one of a coarse WDM, a dense WDM, or other WDM device for controlling a bidirectional stream of optical signals. The WDM is connected to the photodetector 906 via cable 909 and to the laser via cable 919, which, like cable 905, may be fiber optical cables. Positioned between cable 909 and the photodetector 906 is an optical filter 908. The laser, photodetector and optical filter may be comparable to the corresponding components described above in connection with FIGS. 1 and 8. Additionally, the optical signal channels of the photodetector (e.g., $\lambda_1$, $\lambda_2$, $\lambda_3$ and $\lambda_4$) may be different from the optical signal channels of the laser (e.g., $\lambda_5$, $\lambda_6$, $\lambda_7$ and $\lambda_8$).

Each of the optical filter 908 and laser 916 may be monitored using temperature sensors 931, 932 and current sensors 935, 936 in the manners described above. The current sensor 936 used to monitor the laser 916 may be connected to cable 919 through a separate photodetector 934, which is used to convert the transmitted optical signals of the laser (e.g., $\lambda_5$, $\lambda_6$, $\lambda_7$ and $\lambda_8$) into electrical signals. A controller 940 may then receive the monitored signals and instruct a temperature control device to adjust its temperature settings in order to control the temperature of the optical filter 908 or laser 916 in the manner described above. The example of FIG. 9 shows a single controller and single temperature control device, but it will be understood that the optical filter and laser may be coupled to separate controllers, separate temperature control devices, or both.

The optical devices in the above examples are described as including a photodetector and current sensor for directly measuring an incoming or outgoing optical signal. However, in other examples of the disclosure, the optical signal may be directly measured using other measurement instruments, such as a wavelength sensor for sensing a measurement of the filtered/generated optical signal wavelength. The wavelength sensor may be a wavelength meter or spectrum analyzer connected to the input interface of the controller. The measured wavelength may be directly correlated to a corresponding temperature, whereby the temperature of the tunable element (e.g., filter, laser) may be determined.

The optical devices in the above examples are described as including only one temperature control device. However, those skilled in the art would readily recognize that any of the example optical devices may include one or more additional temperature control devices to provide broad but slow temperature regulation of the entire optical device. Optical devices having a plurality of temperature control devices are extensively described in the commonly owned priority application Ser. No. 62/507,279, the disclosure of which is hereby incorporated in its entirety herein.

The optical devices in the above examples can include yet a further temperature control device for regulating a temperature of a laser by heating the laser prior to the laser emitting an optical signal. For instance, in the case of a laser operating in burst-mode, this temperature control device can take advantage of a time delay implemented between a burst-mode switch signal and the laser turning on in order to heat the laser to or close to its normal operating temperature before the laser turns on. Optical devices having such an additional temperature control device are extensively described in the commonly owned priority application Ser. No. 62/635,207, the disclosure of which is hereby incorporated in its entirety herein.

Other aspects of the priority applications Ser. Nos. 62/507,279 and 62/635,207 may also be combined with the present disclosure to provide precise control of an optical signal and stabilize the optical signal wavelength.

As described above, the optical devices, control systems and methods of the present disclosure may provide fast and efficient tuning for transmitting and/or receiving optical signals within a passive optical network (PON). For instance, these devices, systems and methods may be implemented in a modem connected to a PON. Furthermore, the devices, systems and methods described herein may be especially advantageous in a next-generation passive optical network (NG-PON), in which data is expected to be transmitted and received an order of magnitude faster (e.g., ten times faster) than the speed of an ordinary PON.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An optical device comprising:
   at least one temperature-dependent tunable element for controlling a wavelength of an optical signal, wherein the tunable element is one of (i) a laser for transmitting an outgoing optical signal and (ii) an optical filter coupled to a photodetector for receiving an incoming optical signal;
   a first sensor configured to indirectly monitor the optical signal;
   a second sensor configured to directly monitor the optical signal; and
   a control circuit configured to:
      receive a first input from the first sensor;
      adjust the tuned wavelength of the tunable element from a first preselected wavelength to a second preselected wavelength based on the first input received from the first sensor;
      receive a second input from the second sensor monitoring the optical signal of the tunable element as adjusted; and
      maintain the tunable element at the second preselected frequency based on the second input received from the second sensor.

2. The optical device of claim 1, further comprising a temperature control device configured to control the temperature of the tunable element, wherein the control circuit is configured to:
   adjust the tuned wavelength of the tunable element from the first preselected wavelength to the second preselected wavelength by instructing the temperature control device to control the temperature of the tunable element; and maintain the tunable element at the second preselected frequency by instructing the temperature control device to control the temperature of the tunable element.

3. The optical device of claim 2, wherein the temperature control device is a thermoelectric cooler.

4. The optical device of claim 1, wherein the first sensor is a temperature sensor configured to monitor a temperature of the tunable element.

5. The optical device of claim 1, wherein the second sensor is a current sensor configured to monitor a magnitude of electrical current from an electrical signal converted from the optical signal.

6. The optical device of claim 1, wherein the optical device is an optical transceiver comprising each of the laser, the photodetector, and the optical filter.

7. The optical device of claim 1, wherein the optical device comprises the laser, wherein the first sensor is configured to monitor a temperature of the laser, and wherein the second sensor is configured to monitor a magnitude of electrical current of an electrical signal converted from the outgoing optical signal transmitted by the laser.

8. The optical device of claim 1, wherein the optical device comprises the photodetector and the optical filter, wherein the first sensor is configured to monitor a temperature of the optical filter, and wherein the second sensor is configured to monitor a magnitude of electrical current of an electrical signal converted from the incoming optical signal received at the photodetector.

9. The optical device of claim 1, wherein the control circuit is further configured to:
receive an input requesting to adjust a tuned wavelength of the optical device;
compare a temperature corresponding to a current tuned wavelength of the optical device with a temperature corresponding to the requested tuned wavelength;
if the temperature corresponding to the current tuned wavelength is less than the temperature corresponding to the requested tuned wavelength, control a raising of the temperature of the tunable element to the temperature corresponding to the requested tuned wavelength; and
if the temperature corresponding to the current tuned wavelength is greater than the temperature corresponding to the requested tuned wavelength, control a lowering of the temperature of the tunable element to the temperature corresponding to the requested tuned wavelength.

10. The optical device of claim 7, wherein the control circuit is further configured to:
receive a first input from the second sensor;
access from memory a previous input from the second sensor;
compare the magnitude of the electrical signal indicated by the first input from the second sensor with the magnitude of the electrical signal indicated by the previous input from the second sensor;
if the magnitude of the electrical signal indicated by the first input from the second sensor is lower than the magnitude of the electrical signal indicated by the previous input, adjust the tuned wavelength of the laser in a first direction;
receive the second input from the second sensor indicating a magnitude of the electrical signal at the tuned wavelength as adjusted;
compare the magnitude of the electrical signal indicated by the first input from the second sensor to the magnitude of the electrical signal indicated by the second input from the second sensor; and
control the laser based on the comparison between the first and second inputs from the second sensor, such that the tuned wavelength of the laser is maintained at a preselected wavelength.

11. A control circuit included in a device having at least one of an optical transmitter or an optical receiver, and having a temperature-dependent tunable element coupled to said optical transmitter or optical receiver, wherein the control circuit is coupled to the tunable element and is configured to:
receive an input from a first sensor configured to indirectly monitor an optical signal of the tunable element;
tune the temperature-dependent tunable element from a first wavelength to a second tuned wavelength based on the input received from the first sensor;
receive an input from a second sensor configured to directly monitor the optical signal of the tunable element at the second tuned wavelength; and
maintain the tunable element at the second tuned wavelength based on the input received from the second sensor.

12. The control circuit of claim 11, wherein the first sensor is a temperature sensor configured to monitor a temperature of the tunable element, and wherein the control circuit is configured to tune the tunable element from the first tuned wavelength to the second tuned wavelength based on the monitored temperature of the tunable element.

13. The control circuit of claim 12, wherein the control circuit is coupled to a thermoelectric cooler, and wherein the control circuit is configured to instruct the thermoelectric cooler to control a temperature of the tunable element in order to tune the tunable element from the first tuned wavelength to the second tuned wavelength.

14. The control circuit of claim 13, wherein the control circuit is further configured to:
receive an input requesting to adjust a tuned wavelength of the optical device to the second tuned wavelength;
compare a temperature corresponding to the first tuned wavelength of the optical device with a temperature corresponding to the second tuned wavelength of the optical device;
if the temperature corresponding to the first tuned wavelength is less than the temperature corresponding to the second tuned wavelength, control a raising of the temperature of the tunable element to the temperature corresponding to the second tuned wavelength; and
if the temperature corresponding to the first tuned wavelength is greater than the temperature corresponding to the second tuned wavelength, control a lowering of the temperature of the tunable element to the temperature corresponding to the second tuned wavelength.

15. The control circuit of claim 11, wherein the tunable element is one of a laser configured to transmit optical signals or an optical filter configured to filter optical signals received by a photodetector coupled to an output of the optical filter.

16. The control circuit of claim 15, wherein the tunable element is the optical filter, and wherein the second sensor is a current sensor configured to sense a magnitude of electrical current of an electrical signal generated by the photodetector.

17. The control circuit of claim 16, wherein the control circuit is coupled to a thermoelectric cooler, and wherein the control circuit is configured to instruct the thermoelectric cooler to control a temperature of the optical filter in order to maintain the optical filter at the second tuned wavelength.

18. The control circuit of claim 17, wherein the control circuit is further configured to:
receive a first input from the second sensor;
access from memory a previous input from the second sensor;
compare the magnitude of the electrical signal indicated by the first input with the magnitude of the electrical signal indicated by the previous input;
if the magnitude of the electrical signal indicated by the first input is lower than the magnitude of the electrical signal indicated by the previous input, adjust a tuned wavelength of the optical filter in a first direction;
receive a second input from the second sensor indicating a magnitude of the electrical signal at the tuned wavelength as adjusted;
compare the magnitude of the electrical signal indicated by the first input to the magnitude of the electrical signal indicated by the second input; and
control the optical filter based on the comparison between the first and second inputs from the second sensor, such that the tuned wavelength of the optical filter is maintained at the second tuned wavelength.

19. A method of tuning an optical device comprising a control circuit at least one temperature-dependent tunable element for controlling a wavelength of an optical signal transmitted or received by the optical device, wherein the tunable element is one of (i) a laser for transmitting an outgoing optical signal and (ii) an optical filter coupled to a photodetector for receiving an incoming optical signal, wherein the method is executed by the control circuit and comprises:
receiving an input from a first sensor configured to indirectly monitor an optical signal of the tunable element;
tuning the unable element from a first wavelength to a second tuned wavelength based on the input received from the first sensor;
receiving an input from a second sensor configured to directly monitor the optical signal of the tunable element at the second tuned wavelength; and
maintaining the tunable element at the second tuned wavelength based on the input received from the second sensor.

20. The optical device of claim 8, wherein the control circuit is further configured to:
receive a first input from the second sensor;
access from memory a previous input from the second sensor;
compare the magnitude of the electrical signal indicated by the first input from the second sensor with the magnitude of the electrical signal indicated by the previous input from the second sensor;
if the magnitude of the electrical signal indicated by the first input from the second sensor is lower than the magnitude of the electrical signal indicated by the previous input, adjust the tuned wavelength of the optical filter in a first direction;
receive the second input from the second sensor indicating a magnitude of the electrical signal at the tuned wavelength as adjusted;
compare the magnitude of the electrical signal indicated by the first input from the second sensor to the magnitude of the electrical signal indicated by the second input from the second sensor; and
control the optical filter based on the comparison between the first and second inputs from the second sensor, such that the tuned wavelength of the optical filter is maintained at a preselected wavelength.

* * * * *